(12) United States Patent
Park

(10) Patent No.: US 7,709,286 B2
(45) Date of Patent: May 4, 2010

(54) IMAGE SENSOR AND METHOD FOR MANUFACTURING THE SAME

(75) Inventor: So-Eun Park, Gwangjin-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/254,018

(22) Filed: Oct. 20, 2008

(65) Prior Publication Data

US 2009/0115015 A1 May 7, 2009

(30) Foreign Application Priority Data

Nov. 6, 2007 (KR) .................. 10-2007-0112546

(51) Int. Cl.
*H01L 21/00* (2006.01)
(52) U.S. Cl. .................. 438/57; 438/66; 438/700; 257/431; 257/E31.11
(58) Field of Classification Search ............. 257/431, 257/436, 437, 461, 464, E31.055, 629, 638, 257/640; 438/431, 436, 437, 461, 464, 700
See application file for complete search history.

(56) References Cited

U.S. PATENT DOCUMENTS

2006/0145219 A1 7/2006 Lim

2008/0265354 A1* 10/2008 Wen et al. .................. 257/432

FOREIGN PATENT DOCUMENTS

| KR | 1020050059740 A | 6/2005 |
| KR | 1020050105586 A | 11/2005 |
| KR | 1020060077617 A | 7/2006 |

* cited by examiner

*Primary Examiner*—Zandra Smith
*Assistant Examiner*—Paul E Patton
(74) *Attorney, Agent, or Firm*—Sherr & Vaughn, PLLC

(57) ABSTRACT

An image sensor includes defining an active region in a substrate by forming a device isolating layer; and then sequentially forming a photodiode and a logic unit in the active region; and then forming a first passivation layer on the photodiode and the logic unit; and then forming a trench in the first passivation layer by selectively removing a portion of the first protective layer corresponding to an uppermost surface of the photodiode; and then forming a second passivation layer buried in the trench. Forming a thick second passivation layer in the trench which spatially corresponds to the photodiode can offset dangling bonds on the surface of the substrate in a subsequent annealing process while also reducing dark current and enhance photosensitivity of the photodiode.

15 Claims, 3 Drawing Sheets

IMAGE SENSOR AND METHOD FOR MANUFACTURING THE SAME

Figure 1:
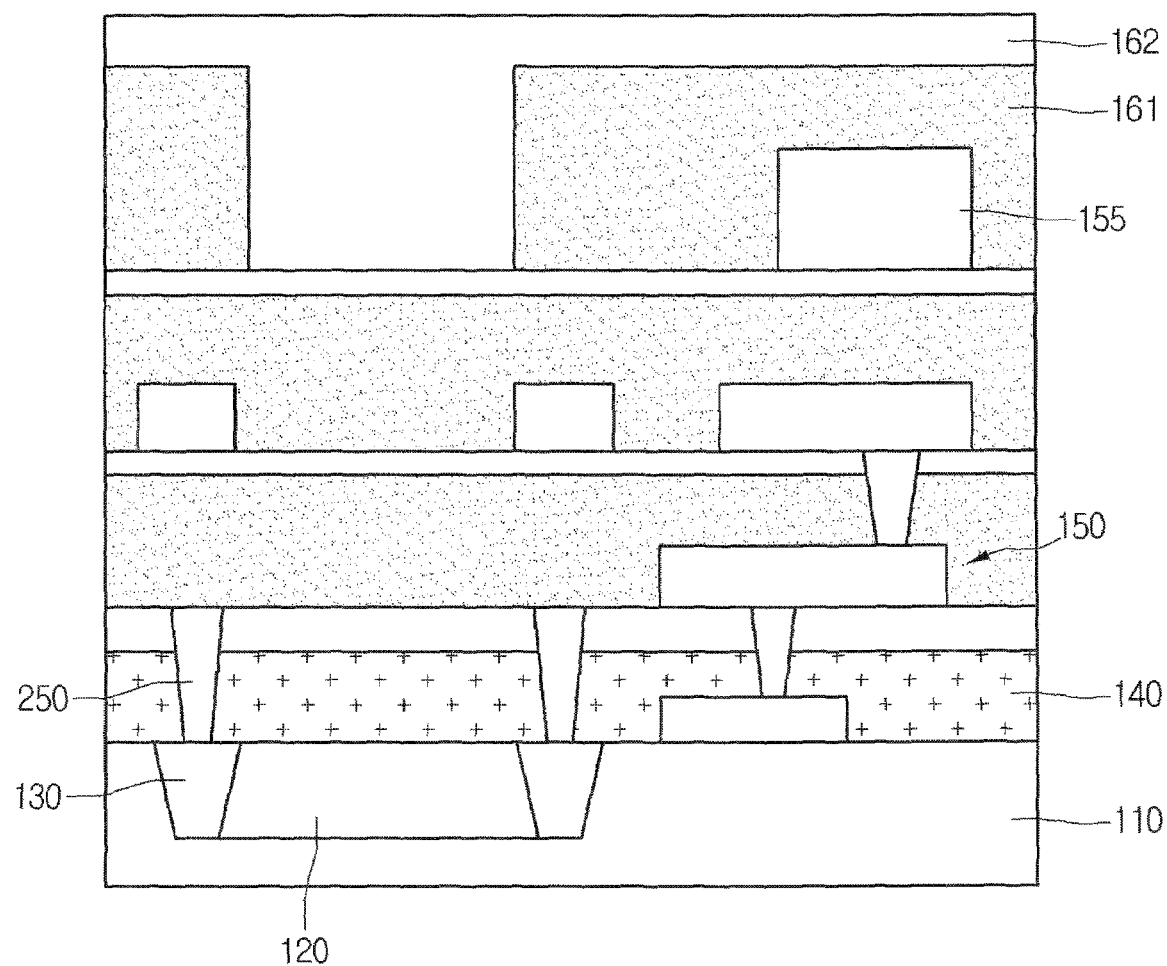

The present application claims priority under 35 U.S.C. §119 to Korean Patent Application No. 10-2007-0112546 (filed on Nov. 6, 2007), which is hereby incorporated by reference in its entirety.

BACKGROUND

A semiconductor device such as a CIS device can be divided into a photo diode region that receives a light signal and converts the light signal into an electrical signal and a transistor region that processes the electrical signal. A disadvantage of such devices is the generation of a dangling bond at an interface between the photo diode and a substrate, thereby resulting in degradation of the image characteristics.

SUMMARY

Embodiments relate to an image sensor and a method for manufacturing the same that enhances a leakage source of a substrate surface using a passivation layer at an uppermost surface of a photodiode (PD) without changing the overall thickness of the image sensor.

Embodiments relate to an image sensor that may include at least one of the following: a substrate having an active region defined by a device isolating region; a photodiode and a logic unit formed in the active region; a first passivation layer formed on and/or over the photodiode and the logic unit, including a trench on an uppermost surface of the photodiode; and a second passivation layer formed in the trench.

Embodiments relate to a method for manufacturing an image sensor that may include at least one of the following steps: defining an active region in a substrate by a device isolating region; and then forming a photodiode and a logic unit in the active region; and then forming a first passivation layer on and/or over the photodiode and the logic unit; and then forming a trench by selectively removing the first protective layer on and/or over the uppermost surface of the photodiode; and then forming a second passivation layer burying the trench.

Embodiments relate to an image sensor that may include at least one of the following: a substrate having an active region defined by a device isolating film; a photodiode and a logic unit formed in the active region; a first passivation layer formed on the photodiode and the logic unit, wherein the first passivation layer includes a trench corresponding to an uppermost surface of the photodiode; and a second passivation layer formed in the trench and on the first passivation layer. In accordance with embodiments, the thickness of the second passivation layer in the trench is greater than the thickness of the passivation layer on the first passivation layer.

Embodiments relate to a method for manufacturing an image sensor that may include at least one of the following steps: providing a substrate having an active region defined by a pair of isolation layers; and then sequentially forming a photodiode and a logic unit in the active region; and then forming a dummy contact directly on and contacting the isolating layers; and then forming an interlayer insulating layer on the substrate including the photodiode and the isolation layers; and then forming a first passivation layer on the photodiode and the logic unit; and then forming a trench in the first passivation layer corresponding spatially to an uppermost surface of the photodiode; and then forming a second passivation layer directly on and contacting the first passivation layer and in the trench. In accordance with embodiments, the thickness of the second passivation layer in the trench is greater than the thickness of the passivation layer on the first passivation layer.

DRAWINGS

Figure 2:
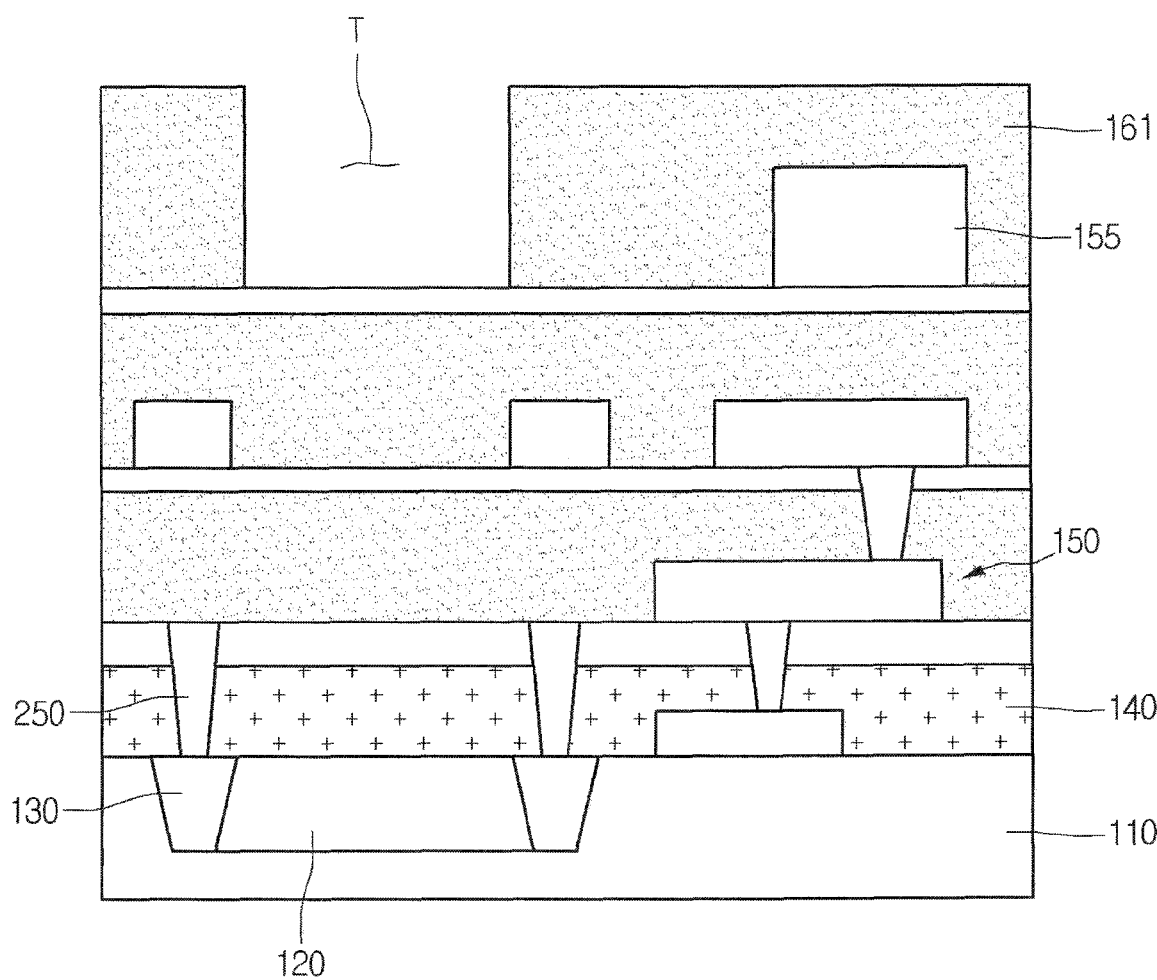
Figure 3:
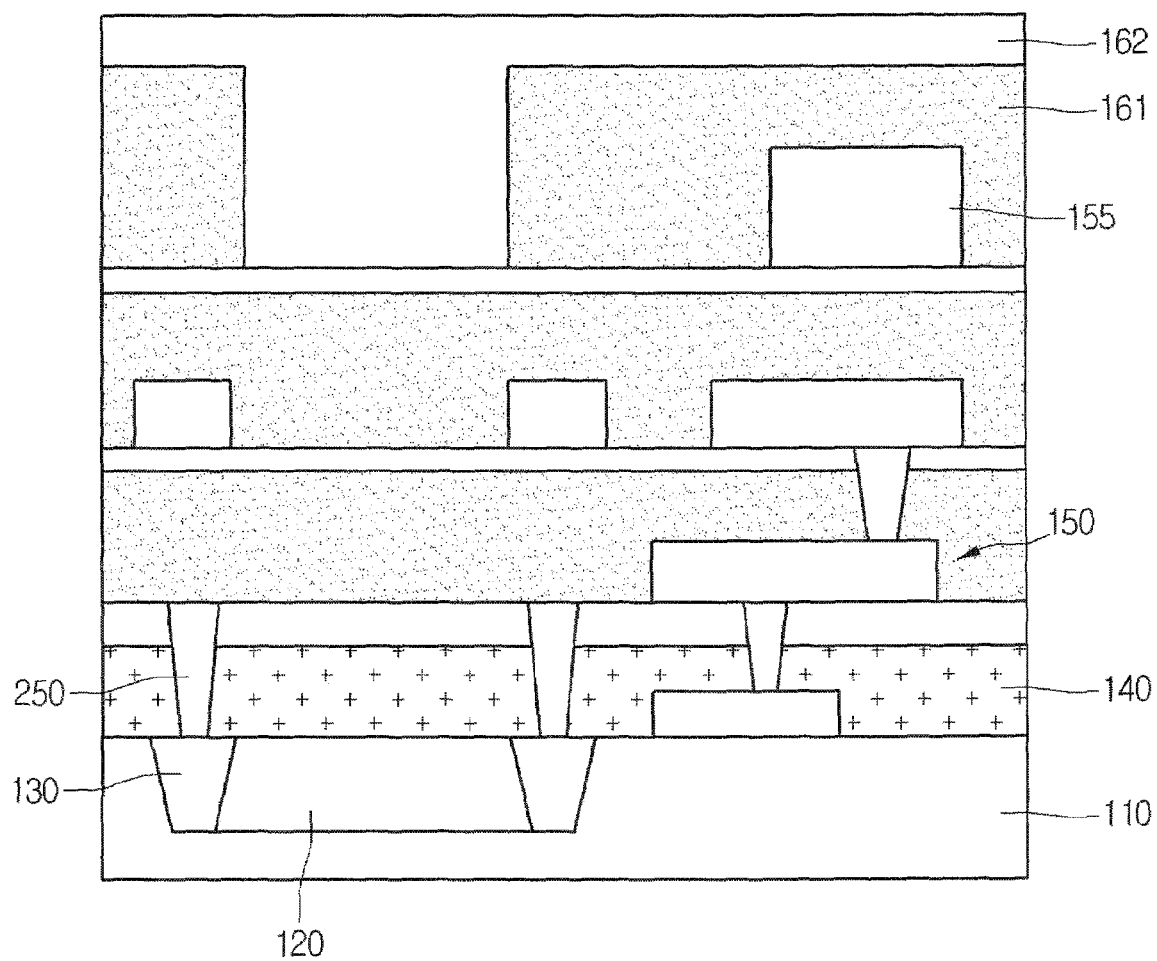

Example FIGS. 1 to 3 illustrate an image sensor and a method for manufacturing an image sensor, in accordance with embodiments.

DESCRIPTION

Hereinafter, an image sensor and a method for manufacturing the same in accordance with embodiments will be described with reference to the accompanying drawings. In accordance with embodiments, it will be understood that when a layer (or film) is referred to as being "on" another layer or substrate, it can be directly on another layer or substrate, or intervening layers may also be present. Further, it will be understood that when a layer is referred to as being "under" another layer, it can be directly under another layer, and one or more intervening layers may also be present. In addition, it will also be understood that when a layer is referred to as being "between" two layers, it can be the only layer between the two layers, or one or more intervening layers may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

As illustrated in example FIG. 1, an image sensor in accordance with embodiments can include substrate 110 having an active region defined by device isolating region 130; photodiode 120 and logic unit 150 formed in the active region; first passivation layer 161 formed on and/or over photodiode 120 and the logic unit 150, including trench T corresponding spatially to an uppermost surface of photodiode 120; and second passivation layer 162 formed in trench T and on and/or over first passivation layer. First passivation layer 161 may be formed on and/or over upper metal 155 of the logic unit. Second passivation layer 162 may be formed in trench T and on and/or over first passivation layer 161. Logic unit 150 may include a transistor, a contact plug and a metal line. The image sensor in accordance with embodiments may thickly form second passivation layer 162 adjacent to photodiode 120 in order to reduce leakage sources from the surface of photodiode 120 by protons (H+) during an annealing process, thereby making it possible to reduce dark current. In essence, the protons (H+) may be implanted to form SiN of second passivation layer 162 so that the leakage sources are reduced, making it possible to reduce generation of dark current. Dummy contact 250 may also be formed on and/or over substrate 110 including device isolating layer 130. Dummy contact 250 may be formed on and/or over device isolating layer 130 being a boundary of pixels to prevent crosstalk between the pixels, thereby making it possible to collect light in photo diode 120.

As illustrated in example FIG. 2, a method for manufacturing an image sensor in accordance with embodiments can include providing substrate 110 having an active region defined by device isolating region 130. Photodiode 120 and logic unit 150 may then be sequentially formed in the active region. Logic unit 150 may include a transistor, a contact plug and a metal line. Dummy contact 250 may then be formed on and/or over substrate 110 including device isolating layer 130. Interlayer insulating layer 140 may then be formed on and/or over substrate 110 including photodiode 120 and logic unit 150. A metal wiring or contact plug 155 may then be formed on and/or over interlayer insulating layer 140 and then first passivation layer 161 is formed thereon and/or thereover. First passivation layer 161 may be an oxide film, but is not limited thereto. Trench T may then be formed by selectively removing a portion of first passivation layer 161 corresponding to the uppermost surface of photodiode 120.

As illustrated in example FIG. 3, second protective layer 162 may then be buried in trench T. Second passivation layer 162 may be a nitride film, for example, SiN, but is not limited thereto. The logic unit may include upper metal layer 155 and second passivation layer 162 may be formed on and/or over trench T and first passivation layer 161. In accordance with embodiments, first passivation layer 161 may be an oxide layer, etc. that is masked using a slightly larger defined mask than photodiode 120. First passivation layer 161 may then be planarized using a CMP process. A portion of first passivation layer 161 is then removed by a process such as RIE, etc. to form trench T corresponding to the uppermost surface of photodiode 120. Second passivation layer 162 is then filled in trench T and over first passivation layer 161 by depositing a nitride film such as SiN, etc. In this way, second passivation layer 162 including a large amount of H+ is adjacent to photodiode 120 to perform a role of offsetting a dangling bond on surface of substrate 110 due to H+ in a post-annealing process while also reducing dark current. Also, controlling the thickness of the nitride film, etc. of second protective layer 162 may be used as an anti-reflection film, making it possible to improve sensitivity. A contact may be formed around photodiode 120 in order to improve the sensitivity of photodiode 120, thereby making it possible to enhance light collection ability. In other words, as requirements for reduced pixel pitch sizes, a light receiving unit may also be reduced, which in turn, reduces the fill factor. Therefore, the maximum collection and focus of light are important issues.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor comprising:
    defining an active region in a substrate by forming a device isolating layer; and then
    sequentially forming a photodiode and a logic unit in the active region; and then
    forming a first passivation layer on the photodiode and the logic unit; and then
    forming a trench in the first passivation layer by selectively removing a portion of the first protective layer corresponding to an uppermost surface of the photodiode; and then
    forming a second passivation layer buried in the trench.

2. The method of claim 1, wherein the logic unit includes an upper metal layer.

3. The method of claim 1, wherein forming the second passivation layer comprises forming the second passivation layer in the trench and directly on and contacting the first passivation layer.

4. The method of claim 3, wherein the thickness of the second passivation layer in the trench is greater than the thickness of the passivation layer on the first passivation layer.

5. The method of claim 1, further comprising, after sequentially forming the photodiode and the logic unit, forming an interlayer insulating layer on the substrate including the photodiode and the logic unit.

6. The method of claim 5, further comprising, after forming the interlayer insulating layer, forming a dummy contact directly on and contacting the device isolating film.

7. A method comprising:
    providing a substrate having an active region defined by a pair of isolation layers; and then
    sequentially forming a photodiode and a logic unit in the active region; and then
    forming a dummy contact directly on and contacting the isolation layers; and then
    forming an interlayer insulating layer on the substrate including the photodiode and the isolation layers; and then
    forming a first passivation layer on the photodiode and the logic unit; and then
    forming a trench in the first passivation layer corresponding spatially to an uppermost surface of the photodiode; and then
    forming a second passivation layer directly on and contacting the first passivation layer and in the trench, wherein the thickness of the second passivation layer in the trench is greater than the thickness of the passivation layer on the first passivation layer.

8. The method of claim 7, wherein the first passivation layer comprises an oxide film.

9. The method of claim 7, wherein the second passivation layer comprises a nitride film.

10. The method of claim 9, wherein the nitride film comprises SiN.

11. The method of claim 7, wherein forming the first passivation layer comprises:
    depositing an oxide film on the substrate; and then
    planarizing the first passivation layer using a CMP process.

12. The method of claim 11, wherein forming the trench in the first passivation layer comprises removing a portion of the first passivation layer using RIE.

13. The method of claim 7, wherein the logic unit includes a metal layer.

14. The method of claim 13, wherein forming the first passivation layer comprises forming an oxide layer on the metal layer.

15. The method of claim 7, wherein the photodiode is formed between the isolation layers.

* * * * *